United States Patent
Pröll et al.

(10) Patent No.: US 6,917,549 B2
(45) Date of Patent: Jul. 12, 2005

(54) INTEGRATED MEMORY AND METHOD FOR OPERATING IT

(75) Inventors: Manfred Pröll, Dorfen (DE); Stephan Schröder, München (DE); Heinz-Joachim Neubauer, München (DE); Evangelos Stavrou, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/759,153

(22) Filed: Jan. 20, 2004

(65) Prior Publication Data

US 2004/0156253 A1 Aug. 12, 2004

(30) Foreign Application Priority Data

Jan. 20, 2003 (DE) .......................................... 103 02 224

(51) Int. Cl.⁷ .................................................. G11C 7/00
(52) U.S. Cl. ......................... 365/203; 365/205; 365/207
(58) Field of Search ................................ 365/203, 205, 365/207

(56) References Cited

U.S. PATENT DOCUMENTS

| | | | |
|---|---|---|---|
| 5,488,583 A | | 1/1996 | Ong et al. |
| 6,181,618 B1 | * | 1/2001 | Inaba et al. .................. 365/203 |
| 6,292,416 B1 | | 9/2001 | Reddy et al. |
| 6,337,824 B1 | * | 1/2002 | Kono et al. .................. 365/207 |
| 6,445,638 B1 | * | 9/2002 | Hsu et al. .............. 365/203.05 |
| 6,473,348 B2 | * | 10/2002 | Sim ........................... 365/205 |
| 6,498,758 B1 | * | 12/2002 | Pomar et al. ................ 365/214 |
| 6,859,406 B2 | * | 2/2005 | Proll et al. .................. 365/205 |
| 2004/0156254 A1 | * | 8/2004 | Proell et al. ................. 365/205 |
| 2004/0184337 A1 | * | 9/2004 | Jakobs ........................ 365/222 |
| 2004/0233737 A1 | * | 11/2004 | Benzinger et al. .......... 365/199 |

* cited by examiner

*Primary Examiner*—Richard Elms
*Assistant Examiner*—Hien Nguyen
(74) *Attorney, Agent, or Firm*—Edell, Shapiro & Finnan, LLC

(57) ABSTRACT

An integrated memory has a memory cell array having word lines and bit lines. The bit lines are organized in bit line pairs. The bit lines of the bit line pairs cross one another at a crossing location and run parallel to one another. A sense amplifier is connected to one of the bit line pairs at one end. Two precharge circuits are provided. One precharge circuit is arranged on a side of the crossing location and the other precharge circuit is arranged on a side of the crossing location. The precharge circuit facing the sense amplifier is arranged at a first distance from the crossing location and at a second distance from the sense amplifier. The RC constant of the bit lines, which is effective during the precharge operation, is reduced, so that the time period required for a precharge operation is reduced.

8 Claims, 3 Drawing Sheets

INTEGRATED MEMORY AND METHOD FOR OPERATING IT

CROSS REFERENCE TO RELATED APPLICATION

This application claims priority under 35 USC §119(e) to German Application No. DE 10302224.4, filed on Jan. 20, 2003, and titled "INTEGRATED MEMORY AND METHOD FOR OPERATING IT," the entire contents of which are hereby incorporated by reference.

FIELD OF THE INVENTION

The present invention relates to an integrated memory having a memory cell array, which has word lines for the selection of memory cells and bit lines for reading out or writing data signals of the memory cells, a sense amplifier and a precharge circuit, and to a method for operating such a memory.

BACKGROUND

An integrated memory, for instance, in the form of a DRAM (Dynamic Random Access Memory) generally has a memory cell array, which includes word lines and bit lines. The memory cells are arranged at crossover points of the word lines and bit lines. The memory cells usually used in integrated dynamic random access memories have a storage capacitance and a selection transistor. The storage capacitances of the memory cells are connected via the selection transistor to one of the bit lines, via which a data signal is read out or written in. The control input of the selection transistor is connected to one of the word lines.

During a memory access, firstly a word line is activated. As a result, the memory cells arranged along a word line are in each case conductively connected to a bit line via the respective selection transistor. In this case, the stored charge is divided up in accordance with the memory cell capacitance and bit line capacitance. In accordance with the ratio of these two capacitances (i.e., a transfer ratio), this leads to a deflection of the bit line voltage. The sense amplifier situated at one end of the bit line compares this voltage with the constant voltage on the associated complementary bit line and amplifies the relatively low potential difference between the bit line and the complementary bit line until the bit line has reached the full signal level for a stored logic 1, which, for example, corresponds to a positive supply potential, or the signal level for a logic 0, which for example corresponds to a reference potential. The inverse signal levels are reached at the same time on the associated complementary bit line.

In order to achieve an arrangement of the memory cell array that is as compact as possible, generally the longest possible bit lines are sought. However, this leads to correspondingly high bit line capacitances. The consequence is a reduction of the memory cell signal to be detected by the sense amplifier as a result of impairment of the transfer ratio and an increased coupling between adjacent bit lines causing disturbing crosstalk.

In order to reduce the coupling between adjacent bit lines, the bit lines of a memory are often provided with a bit line twist to minimize the bit line coupling. The bit lines of such a memory are organized in bit line pairs. The bit lines of a bit line pair cross one another at a crossing location, the bit line twist, and otherwise run parallel to one another. Having a bit line twist causes increased series resistances on the respective bit line as a result of the crossing of bit lines.

After the access to the memory cell array, the previously selected word lines are deactivated. Afterward, the bit lines are put into the precharge state as rapidly as possible, proceeding from which state a renewed memory access can be effected. For this purpose, for each bit line pair, the respective bit line and associated complementary bit line are short-circuited and additionally connected at high impedance to a supply voltage network of the memory. In order to precharge the bit lines, generally a precharge circuit is situated in the vicinity of the assigned sense amplifier at the edge of the memory cell array. The precharge circuit assigned to a bit line pair and the assigned sense amplifier are connected to the bit line pair at one end of the bit line pair at the edge of the memory cell array. The consequence is that the precharge operation of a bit line pair causes a relatively high RC constant, due to the relatively high series resistances and bit line capacitances of the long bit lines provided with a bit line twist. However, this leads to a comparatively slow precharge operation.

SUMMARY

The present invention is based on specifying an integrated memory of the type in which the time period required for a precharge operation of bit lines is reduced.

Such a memory can include two precharge circuits, which are connected to one of the bit line pairs in order to precharge the bit lines of the bit line pair to a precharge voltage. The precharge circuit facing the sense amplifier is arranged at a first distance from the crossing location of the bit lines (bit line twist) and at a second distance from the sense amplifier. The first distance can be less than the second distance. Thus, the previous construction principle of arranging the precharge circuit in direct proximity to the assigned sense amplifier of a bit line pair at the edge of a memory cell array is not followed. By contrast, according to the invention, the precharge circuits are moved into the center of the memory cell array, for example, in the vicinity of the crossing location of a bit line twist. The RC constant of the bit lines which is effective during the precharge operation, can be reduced, so that the time period required for a precharge operation of the bit lines is significantly reduced. Since including a bit line twist, which is generally arranged in the center of the memory cell array, can interrupt the regular structure of the memory cell array at this location, the precharge circuits can be moved into the center of the memory cell array, if the precharge circuits can be arranged in direct proximity to the bit line twist. Accordingly, the distance from the precharge circuits to the crossing location of the bit line twist can be less than the distance to the sense amplifier at the edge of the memory cell array.

BRIEF DESCRIPTION OF THE FIGURES

The invention is explained in more detail below with reference to the figures illustrated in the drawing, in which.

DETAILED DESCRIPTION

Figure 1:
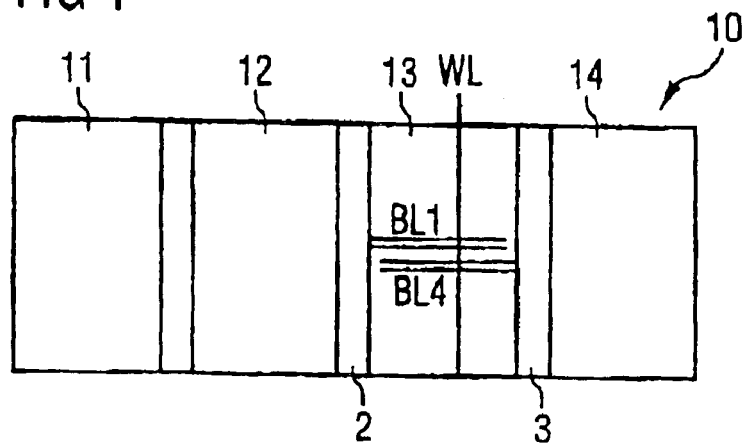
FIG. 1 shows a roughly diagrammatic illustration of an embodiment of a memory cell array of an integrated memory.

A memory cell array of an integrated memory 10 that is subdivided into blocks is shown roughly diagrammatically in FIG. 1. In this case, the memory cell blocks can be formed by the individual memory cell arrays 11, 12, 13 and 14. As illustrated in greater detail on the basis of the memory cell array 13, the individual memory cell arrays can have word lines WL for the selection of memory cells and bit lines, illustrated by way of example on the basis of bit lines BL1 and BL4, for reading out or writing data signals of the memory cells. The memory cells (not illustrated here) can be arranged in a known manner at crossover points of the word lines and bit lines and can be connected to one of the word lines and one of the bit lines. The bit lines can be organized in bit line pairs. The bit lines of a bit line pair can run parallel to one another over wide regions, as indicated in FIG. 1.

The memory cell array 13 can be bounded by the sense amplifier strips 2 and bit lines 3. The bit line, in the longitudinal direction of the sense amplifier strips, can be alternately connected to one of the sense amplifiers of the sense amplifier strip 2 and to one of the sense amplifiers of the sense amplifier strip 3. This enables a compact arrangement of a memory cell array since the respective sense amplifiers can be arranged opposite one another in a space-saving manner.

Figure 3:
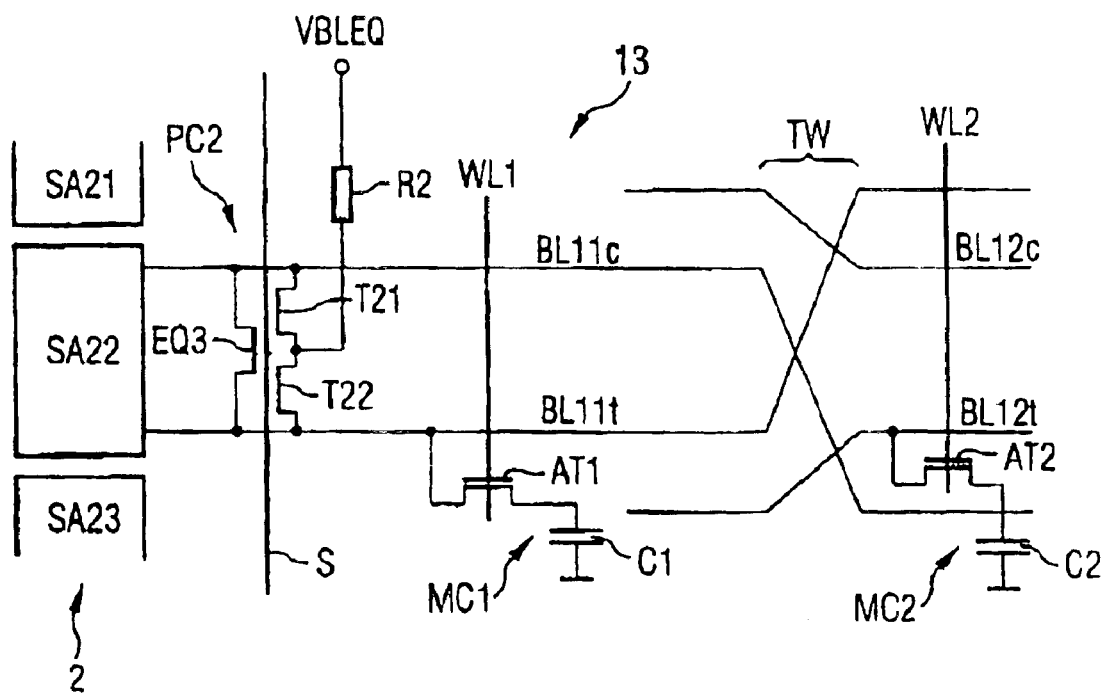
FIG. 3 shows a partial circuit of an integrated memory according to the prior art.

FIG. 3 shows a partial circuit of an integrated memory according to the prior art, which memory is constructed according to the principle of the memory in accordance with FIG. 1. The individual sense amplifiers SA21, SA22 and SA23 can be arranged in the sense amplifier strip 2. A sense amplifier for the bit line pair BL12c, BL12t can be situated in the sense amplifier strip 3. The sense amplifier is not shown in FIG. 3. The word lines WL1, WL2 and the bit lines BL11t, BL11c, BL12c, BL12t, can be arranged in the memory cell array 13. In this case, the bit lines BL11t, BL11c, BL12c, BL12t can be organized in bit line pairs. The bit lines BL11t, BL11c can cross one another at a crossing location, a bit line twist TW, and otherwise essentially run parallel to one another. The course of the bit lines BL12c, BL12t can change at the bit line twist TW in a manner corresponding to the bit lines BL11c, BL11t.

The memory cells MC1, MC2 can be arranged at crossover points of word lines and bit lines. The memory cells MC1, MC2 in each case can have a selection transistor AT1, AT2 and a storage capacitor C1, C2. The control inputs of the selection transistors AT1, AT2 can be connected to the word line WL1 and WL2, respectively, by which the memory cells can be activated during a memory access. For this purpose, the selection transistors AT1, AT2 can be turned on by the word lines WL1, WL2. If the respective selection transistor is open, the charge stored in the respective memory cell capacitance C1, C2 can pass onto the corresponding bit line BL11t, BL12t and from there into the corresponding sense amplifier. Including the bit line twist TW can reduce the bit line coupling, in particular, in the case of comparatively long bit lines. In this case, the bit line twist can be arranged approximately in the center of a respective bit line.

The memory in accordance with FIG. 3 can have a precharge circuit PC2 connected to the bit lines BL11c, BL11t. The precharge circuit PC2 can precharge the bit lines to a precharge voltage VBLEQ. The precharge voltage can be less than a supply voltage VDD of the memory in the present exemplary embodiment. The precharge circuit PC2 can have the precharge transistors T21, T22, the controlled paths of which can be connected, on the one hand, to a terminal for the voltage VBLEQ and, on the other hand, to one of the bit lines BL11c, BL11t. Furthermore, a switch EQ3 can be provided, by which the bit lines BL11c, BL11t can be connected to one another, i.e., "equalizing". The precharge transistors T21, T22 and the switch EQ3 can be driven via the control line S. The precharge transistors T21, T22 can be connected to the voltage VBLEQ via the resistor R2. The memory circuit according to FIG. 3 can have a precharge operation for precharging the bit lines BL11c, BL11t with a relatively large RC constant, due to relatively high series resistances and bit line capacitances of the bit lines BL11c, BL11t, which are relatively long and include a bit line twist.

Figure 2:
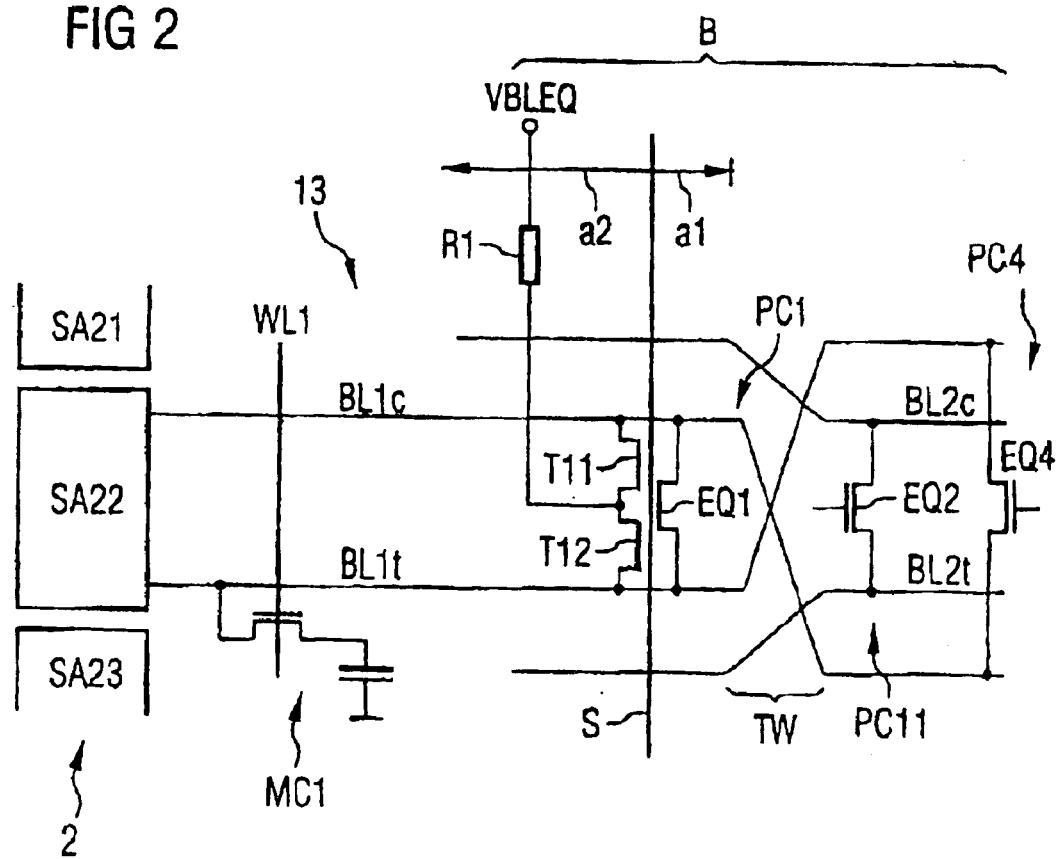
FIG. 2 shows an embodiment of a partial circuit of an integrated memory with a precharge circuit arranged according to the invention.

FIG. 2 shows a partial circuit of an integrated memory according to the invention, which memory is fundamentally constructed according to the construction principles of the memories in accordance with FIGS. 1 and 3. The illustration of the word line WL2 and of the associated memory cell MC2 has been dispensed with in FIG. 2 for the sake of clarity. For better clarity, the memory cell MC1, the word line WL1 and the bit lines BL1c, BL1t, BL2c, BL2t are illustrated in FIG. 2. In reality, a multiplicity of memory cells, word lines and bit lines can be provided in each case.

In contrast to the memory in accordance with FIG. 3, in the memory in accordance with FIG. 2, the precharge circuit PC1 can be arranged in direct proximity to the bit line twist TW. In particular, the precharge circuit PC1 can be arranged at a first distance a1 from the bit line twist TW and at a second distance a2 from the sense amplifier SA22. The distance a1 can be less than the distance a2. The precharge circuit PC1 can have the precharge transistors T11, T12 with controlled paths that can be connected via the resistor R1 to a terminal for the supply voltage VBLEQ and to one of the bit lines BL1c, BL1t. Furthermore, an equalize switch EQ1 can be provided, which can connect the bit lines BL1c, BL1t to one another. The precharge transistors T11, T12 and the switch EQ1 can be driven via the control line S. For the bit lines BL2c, BL2t, a precharge circuit PC1 can be provided, indicated by the equalize transistor EQ2.

The precharge circuit PC1 can be arranged within a region B, which can be relatively smaller than the memory cell array 13 and which can be arranged centrally in relation to the longitudinal extent of the bit lines BL1c, BL1t. The bit line twist TW can be arranged within the region B. In this case, the central arrangement of the bit line twist TW is illustrated in distorted fashion in FIG. 2 for reasons of clarity. Since the bit line twist TW can interrupt the regular structure of the memory cell array 13, the precharge circuit PC1 can be arranged in direct proximity to the bit line twist TW. Accordingly, the distance a1 can be less than the distance a2.

In accordance with FIG. 2, two precharge circuits PC1, PC4 in accordance with the construction of the precharge circuit PC1 can be provided for the bit lines BL1c, BL1t. One of the precharge circuits (PC1) can be arranged on a side of the bit line twist TW, which faces the sense amplifier SA22; the other of the precharge circuits (PC4) can be arranged on a side of the bit line twist TW, which is remote from the sense amplifier SA22. For reasons of clarity, the precharge circuit PC4 is illustrated in simplified fashion in FIG. 2, indicated by the equalize transistor EQ4. Its construction may be similar to the precharge circuit PC1 and the driving may also be effected via the control line S. Both precharge circuits PC1, PC4 can be arranged within the region B. In the configuration of the memory in accordance with FIG. 2, it is possible to use a plurality of precharge transistors in each case of half width on the right and on the left of the bit line twist TW.

Figure 4A:
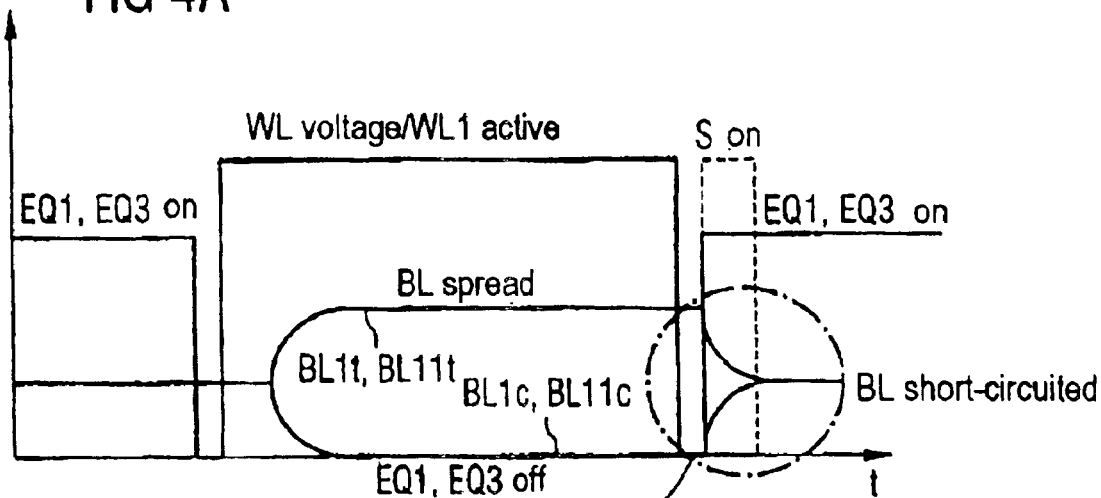
FIGS. 4A and 4B show signal diagrams of a precharge operation for precharging bit lines according to the invention in comparison with the prior art.
Figure 4B:
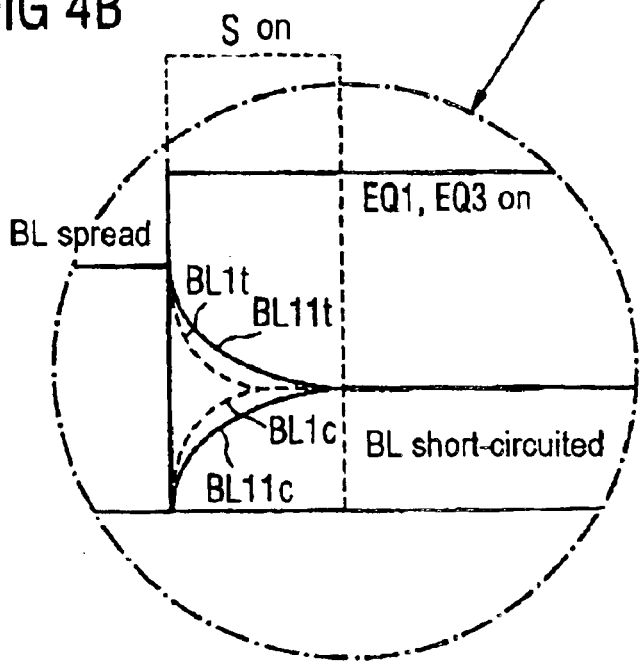

FIGS. 4A and 4B show signal diagrams of a precharge operation of bit lines of a memory in accordance with FIG. 2 in comparison with a precharge operation of bit lines of a memory in accordance with FIG. 3. As illustrated in FIG. 4A, the equalize transistors EQ1, EQ4, EQ3 CAN initially be in the on state. The bit lines BL1t, BL1c and BL11t, BL11c can be at the common precharge potential VBLEQ. At the beginning of a memory access, the word line WL1 can be activated, so that memory cell MC1 can be selected, i.e., selection transistor AT1 can be turned on. If the selection transistor AT1 is in the on state, the charge stored in the memory cell capacitance C1 can pass onto the bit line BL1t and BL11t and from there into the sense amplifier SA22, which can spread the respective bit lines. At the same time, the stored signal can be written back to the memory cell MC1 again (i.e., a refresh). After the deactivation of the word line WL1, the control line S can be put into the active state, so that the bit lines BL1t, BL1c and BL11t, BL11c can be short-circuited and precharged to the voltage VBLEQ.

FIG. 4B shows an enlarged detail view for the operation described last. Due to the lower RC constant, the bit lines BL1t, BL1c of the memory according to the invention in accordance with FIG. 2 can be precharged to the potential VBLEQ more rapidly than the bit lines BL11t, BL11c of the memory in accordance with FIG. 3.

| List of Reference Symbols | |
|---|---|
| 2, 3 | Sense amplifier strip |
| 10 | Memory |
| 11–14 | Memory cell array |
| WL, WL1, WL2 | Word lines |
| BL1, BL4 | Bit line |
| BL1c, BL1t | Bit line |
| BL2c, BL2t | Bit line |
| BL11c, BL11t | Bit line |
| BL12c, BL12t | Bit line |
| S | Control line |
| T11, T12 | Precharge transistor |
| T21, T22 | Precharge transistor |
| EQ1–EQ4 | Equalize transistor |
| AT1, AT2 | Selection transistor |
| C1, C2 | Memory cell capacitance |
| MC1, MC2 | Memory cell |
| TW | Bit line twist |
| SA21–SA23 | Sense amplifier |
| a1, a2 | Distance |
| B | Region |
| PC1, PC11 | Precharge circuit |
| PC2, PC4 | Precharge circuit |
| R1, R2 | Resistor |
| VBLEQ | Precharge voltage |

We claim:

1. An integrated memory, comprising:
a memory cell array, the memory cell array having word lines for the selection of memory cells and bit lines for reading out or writing data signals of the memory cells, the bit lines being organized in bit line pairs, the bit lines of one of the bit line pair crossing one another at a crossing location and running parallel to one another;
a sense amplifier, which is connected to one of the bit line pairs at one end of the bit line pair;
two precharge circuits, the precharge circuits being connected to one of the bit line pairs in order to precharge the bit lines of the bit line pair to a precharge voltage, one of the precharge circuits being arranged on a side of the crossing location which faces the sense amplifier, the other of the precharge circuits being arranged on a side of the crossing location which is remote from the sense amplifier,
the first precharge circuit facing the sense amplifier being arranged at a first distance from the crossing location and at a second distance from the sense amplifier, the first distance being less than the second distance.

2. The integrated memory as claimed in claim 1, wherein at least one of the precharge circuits is arranged within a region, the region being relatively smaller in relation to the memory cell array and being arranged centrally in relation to the longitudinal extent of the relevant bit line pair.

3. The integrated memory as claimed in claim 1, wherein at least one of the precharge circuits has a precharge transistor, the controlled path of the precharge transistor being connected to a terminal for a supply voltage of the memory and to one of the bit lines of the respective bit line pair.

4. The integrated memory as claimed in claim 1, wherein at least one of the precharge circuits has a switch, the bit lines associated with the respective bit line pair being connected to one another via the switch.

5. A method for operating an integrated memory, the integrated memory including a memory cell array, the memory cell array having word lines for the selection of memory cells and bit lines for reading out or writing data signals of the memory cells, the bit lines being organized in bit line pairs, the bit lines of one of the bit line pair crossing one another at a crossing location and running parallel to one another;
a sense amplifier, which is connected to one of the bit line pairs at one end of the bit line pair;
two precharge circuits, the precharge circuits being connected to one of the bit line pairs in order to precharge the bit lines of the bit line pair to a precharge voltage, one of the precharge circuits being arranged on a side of the crossing location which faces the sense amplifier, the other of the precharge circuits being arranged on a side of the crossing location which is remote from the sense amplifier, the first precharge circuit facing the sense amplifier being arranged at a first distance from the crossing location and at a second distance from the sense amplifier, the first distance being less than the second distance, comprising:
activating one of the word lines at the beginning of a memory access to select one of the memory cells;
passing the charge stored in one of the memory cells to one of the bit lines;
passing the charge from the last line to the sense amplifier, which spreads the respective bit lines;
writing back the signal stored in one of the memory cells to one of the memory cells again; and
activating a control line for driving one of the precharge circuits, after the deactivation of one of the word lines, so that the bit lines of a bit line pair are short-circuited and precharged.

6. The integrated memory as claimed in claim 5, wherein at least one of the precharge circuits is arranged within a region, the region being relatively smaller in relation to the memory cell array and being arranged centrally in relation to the longitudinal extent of the relevant bit line pair.

7. The integrated memory as claimed in claim 5, wherein at least one of the precharge circuits has a precharge transistor, the controlled path of the precharge transistor being connected to a terminal for a supply voltage of the memory and to one of the bit lines of the respective bit line pair.

8. The integrated memory as claimed in claim 5, wherein at least one of the precharge circuits has a switch, the bit lines associated with the respective bit line pair being connected to one another via the switch.

* * * * *